US006927458B2

(12) United States Patent
Worley

(10) Patent No.: US 6,927,458 B2
(45) Date of Patent: Aug. 9, 2005

(54) BALLASTING MOSFETS USING STAGGERED AND SEGMENTED DIFFUSION REGIONS

(75) Inventor: Eugene R. Worley, Irvine, CA (US)

(73) Assignee: Conexant Systems, Inc., Newport Beach, CA (US)

(*) Notice: Subject to any disclaimer, the term of this patent is extended or adjusted under 35 U.S.C. 154(b) by 0 days.

(21) Appl. No.: 10/637,324

(22) Filed: Aug. 8, 2003

(65) Prior Publication Data

US 2005/0029597 A1 Feb. 10, 2005

(51) Int. Cl.[7] .......................... H01L 27/02; H01L 29/78
(52) U.S. Cl. ....................... 257/361; 257/355; 257/357; 361/56
(58) Field of Search ................................ 257/355, 357, 257/360–363, 528, 536, 538, 758, 763, 768

(56) References Cited

U.S. PATENT DOCUMENTS

| | | | | |
|---|---|---|---|---|
| 4,724,471 A | * | 2/1988 | Leuschner | 257/360 |
| 5,440,163 A | * | 8/1995 | Ohhashi | 257/355 |
| 5,763,919 A | | 6/1998 | Lin | 257/360 |
| 6,441,410 B2 | | 8/2002 | Gauthier, Jr. et al. | 257/256 |
| 6,559,507 B1 | | 5/2003 | Vashchenko et al. | 257/356 |
| 6,583,972 B2 | | 6/2003 | Verhaege et al. | 361/56 |
| 6,587,320 B1 | | 7/2003 | Russ et al. | 361/56 |

OTHER PUBLICATIONS

K.G. Verhaege et al.; "Novel Design of Driver and ESD Transistors with Significantly Reduced Silicon Area"; 2001, pp. 1–12.
B. Keppens, et al.; "Area compact, ESD robust, Fully silicided NMOS using novel Active Area Ballasting (AAB) technique"; 2003, pp. 1–4.
S. Drüen, et al.; "ESD compact–stimulation: investigation of inverter failure"; 2003; pp. 1–4.
Karlheinz Bock, et al.; "Influence on Well Profile and Gate Length on the ESD Performance of a Fully Silicided 0.25 $\mu$m CMOS Technology"; Oct. 1998; pp. 286–294.
Tung–Yang Chen and Ming–Dou Ker, "Investigation of the Gate–Driven Effect and Substrate–Triggered Effect on ESD Robustness of CMOS Devices"; Dec. 2002; pp. 190–203.

* cited by examiner

Primary Examiner—Minhloan Tran
Assistant Examiner—Thomas L. Dickey
(74) Attorney, Agent, or Firm—Hogan & Hartson, LLP

(57) ABSTRACT

An ESD protection circuit includes a field effect transistor device configured such that current flowing through a hot spot filament formed in a gate region must flow in a non-linear path from a drain contact to a source contact. Source diffusion areas are segmented and staggered relative to drain diffusion areas in order to provide the non-linear current path.

8 Claims, 9 Drawing Sheets

BALLASTING MOSFETS USING STAGGERED AND SEGMENTED DIFFUSION REGIONS

FIELD OF THE INVENTION

The present invention relates to MOSFETs used in ESD protection circuitry and, more particularly, relates to MOSFETs having staggered and segmented diffusion regions to lengthen the filament current path.

BACKGROUND OF THE INVENTION

Electrostatic discharge (ESD) is the spontaneous and rapid transfer of electrostatic charge between two objects having different electrostatic potentials. Familiar examples of ESD range from the relatively harmless, such as the shock one might receive after shuffling across a carpet and touching a doorknob, to the extreme, such as a lightning bolt. In the world of electronic devices and in particular integrated circuits (ICs), ESD is a very significant problem. The heat generated by ESD can cause metal to open due to melting, junction electrothermal shorts, oxide rupture or other serious damage to the IC components. Susceptibility to ESD increases with the shrinking size of technology, and components directly connected to the I/O pads are particularly vulnerable.

In view of the above, ESD protection devices are present in every modern IC. They are typically placed in parallel with the circuitry to be protected so that large transient currents caused by ESD events can be safely shunted away. Such devices are sometimes referred to in the industry as ESD "clamps" as the node voltage is clamped to a safe level.

N-type metal-oxide semiconductor field effect transistors (MOSFETs) (commonly referred to as NMOSs or NFETs) are commonly used as ESD protection devices in ICs. Typically, the drain of the NMOS is connected to the pad and the gate (usually grounded) is coupled to the source. As depicted in FIG. 1, as the drain voltage rises during an ESD transient, reverse bias current also increases (region 10) until the trigger voltage $V_t$ of the parasitic bipolar transistor (comprised of the drain, body and source) is reached. At the trigger voltage, avalanche occurs and the I–V characteristic enters what is known in the industry as "snapback" (region 12). Without some provision for conduction uniformity, the current would increase virtually unchecked until burn-out occurred (dashed line 14). However, if conduction uniformity is provided, a safe current limit at high ESD voltages can be maintained (region 16) and the ESD current can be safely shunted away from the IC circuitry.

Conduction uniformity is achieved by adding ballasting resistance between the gate and drain of the NFET. FIG. 2 depicts a conventionally-ballasted NFET 20. NFET 20 includes drain 22 (N+ diffusion or implant region), gate (typically polysilicon) 24 and source 26. The drain diffusion 22 and the source diffusion 26 are typically salicided, and ballasting is achieved by extending the spacing Scgd between drain contacts 28 and gate 24, and inserting a salicide block mask 30. Insertion of block mask 30 causes the resistivity of the N+ diffusion or implant region to increase from about 7 Ω/square to about 100 Ω/square. To keep contact resistance low and ohmic, the drain contacts 28 should be directly coupled to the salicided diffusion region. Hence, an opening 32 is formed in block mask 30 to keep salicide in the region of drain contacts 28. An additional spacing Scsb is provided between block mask 30 and contacts 28 for this purpose.

Ballasting resistance serves several functions. First, it allows uniform snap-back triggering on the section or fingers of a MOSFET. Without a ballast resistance, one section may trigger ahead of others and become destroyed before other sections turn on. Ballast resistance raises the failure voltage of a section to the point where other sections can trigger before the first triggering section fails. Second, current and heat build-up in channel regions reaching the critical temperature is limited. The Critical temperature is the temperature at which the intrinsic carrier concentration or thermal generated carrier concentration exceeds the background carrier concentration.

One problem with prior art ESD protection devices such as NFET 20 is that the ballasting region is long and space consuming. For a conventional, unballasted NFET in a 0.15 μm process, for example, the spacing Scgd between the drain contacts and gate is about 0.15 μm. Where ballasting is employed, as in FIG. 2, the spacing Scgd increases dramatically to over 2 μm. This large gate-to-drain contact dimension not only increases layout area but also increases drain capacitance. To deal with heat generation at source contacts 34, the spacing Scp between poly gate 24 and source contacts 34 must also be quite large, and is typically in the range from 0.5 to 0.8 μm.

NFET 20 is susceptible to failure as a result of the formation of hot spots during snapback. Hot spots are a consequence of a second breakdown in which a region between the drain and source diffusion areas reaches a critical temperature wherein the charge carrier density is dominated by thermally generated carriers. The exponential relationship between carrier density and temperature and the resulting decrease in regional resistance with increasing temperature results in thermal "runaway". A positive feedback mechanism exists between the regional temperature and electrical power. The process of rapid temperature increase results in the formation of a conductive filament 36 which being formed under gate 24 and ultimately melts the silicon thereby forming a permanent short circuit between drain 22 and source 26.

As seen in FIG. 2, the current conducting into filament 36 spreads out away from filament 36 and is able to flow in an expanding path 38 toward the drain contacts 28. The expanding flow pattern creates a small series resistance seen by the filament unless the resistivity of the ballast resistance region is large or the length of the ballast region is large. The inventor has realized that the series resistance seen by the conducting hot spot filament itself is a significant factor in inhibiting the conductive filament from reaching the melt temperature of silicon and is a greater factor in inhibiting permanent damage than the overall drain resistance per se.

SUMMARY OF THE INVENTION

The present invention provides MOSFET-based ESD protection devices that add series resistance to the path that a hot spot filament current must take by requiring the current to flow both laterally and vertically in going from the drain contacts to the source contacts. This construction also adds to the total resistance of the MOSFET thereby extending the failure voltage of a MOSFET in snap-back which allows multiple fingers to trigger. This is achieved by segmenting the active or diffusion areas in both the drain and the source, and staggering the segments so that drain segments are not opposite source segments. Since the drain and source diffusion segments are offset (staggered), the filament current path is lengthened and includes lateral and vertical components, and the resistance seen by the hot spot filament is accordingly increased.

Accordingly, one embodiment of the invention is a field effect transistor device for providing electrostatic discharge protection. It includes a gate, a source diffusion area having source contacts and a drain diffusion area having drain contacts. The drain contacts are staggered relative to the source contacts so that current associated with any hot spot filaments see an increased resistance in a conduction path from a source contact to a drain contact.

Another embodiment of the invention is a MOSFET comprising segmented source diffusion areas that are staggered relative to segmented drain diffusion areas.

Another embodiment of the invention is an ESD protection circuit comprising a field effect transistor device configured such that current flowing through a hot spot filament formed in a gate region must flow in a non-linear path from a drain contact to a source contact.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

The present invention provides an improved MOSFET-type ESD protection device in which resistance is added to the path that a hot spot filament current must take by requiring the current to flow both laterally and vertically in going from the drain contacts to the source contacts. This is achieved by segmenting the active or diffusion areas in both the drain and the source, and staggering the segments so that drain segments and contacts are not opposite source segments and contacts. Since the drain and source diffusion segments are offset (staggered), the filament current path is lengthened and includes lateral and vertical components, and the resistance seen by filament hot spots is accordingly increased.

Figure 3:
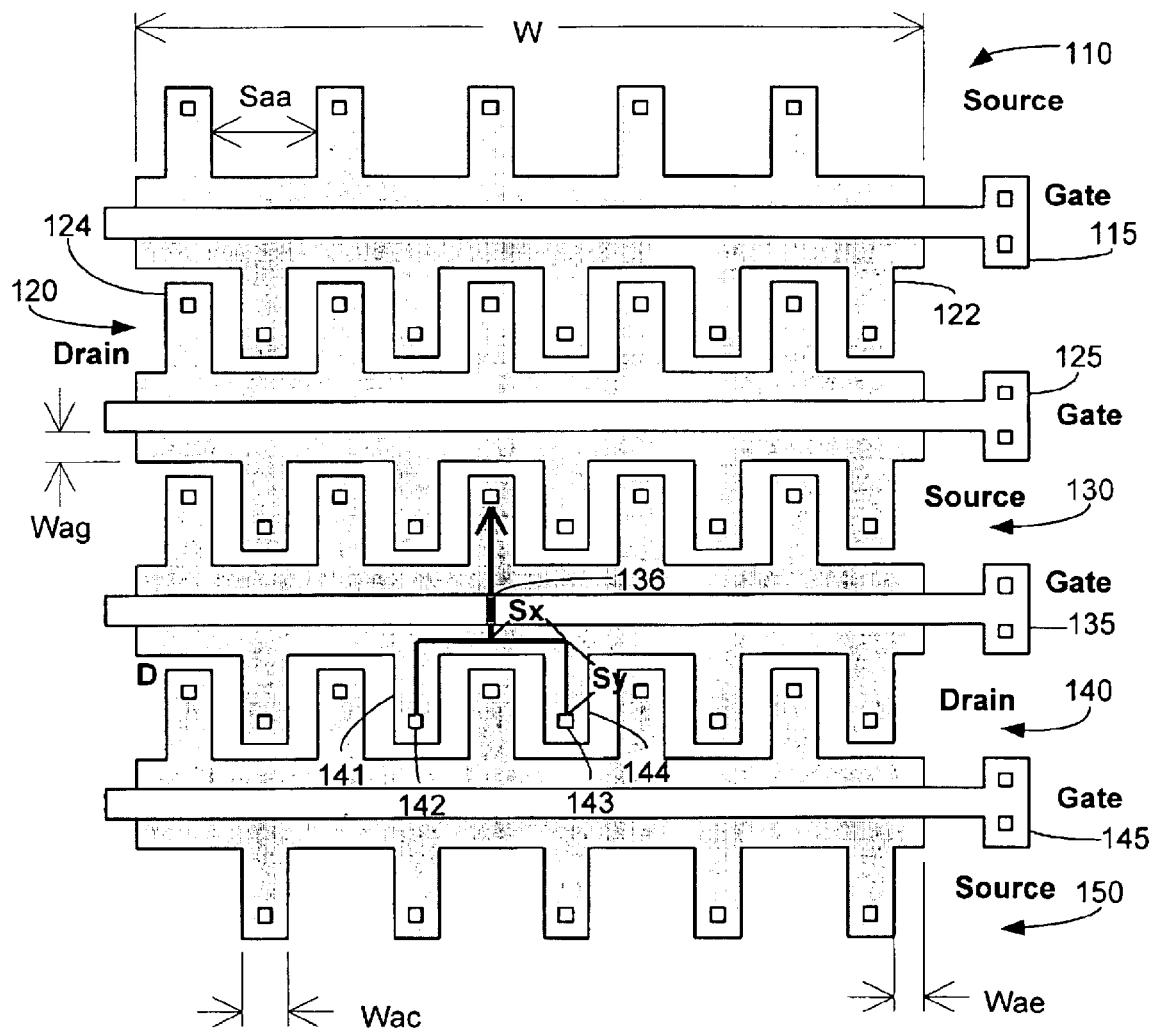
FIG. 3 is a schematic diagram of a MOSFET device according to a first embodiment of the present invention.

One embodiment of the present invention is illustrated in FIG. 3. Multi-finger MOSFET device 100 includes gates 115, 125, 135 and 145, sources 110, 130 and 150, and drains 120 and 140. Hence, a first FET is defined by source 110, gate 115 and drain 120; a second FET is defined by drain 120, gate 125 and source 130; a third FET is defined by source 130, gate 135 and drain 140; and a fourth FET is defined by drain 140, gate 145 and source 150.

Figure 1:
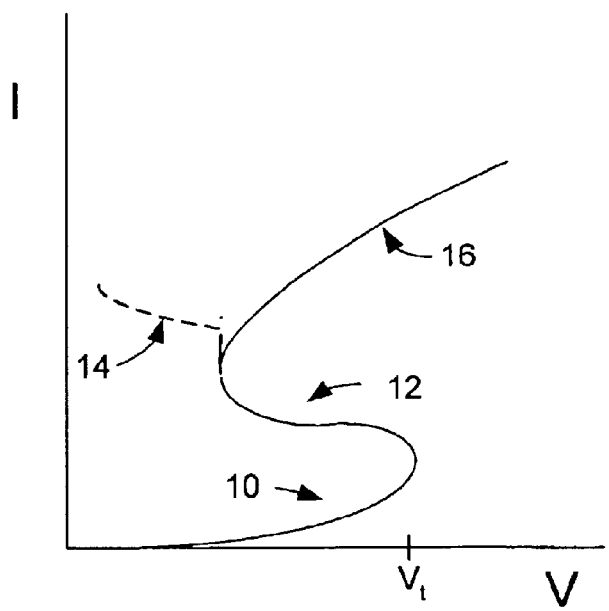
FIG. 1 is a graph depicting an I–V characteristic for a snapback MOSFET device.
Figure 2:
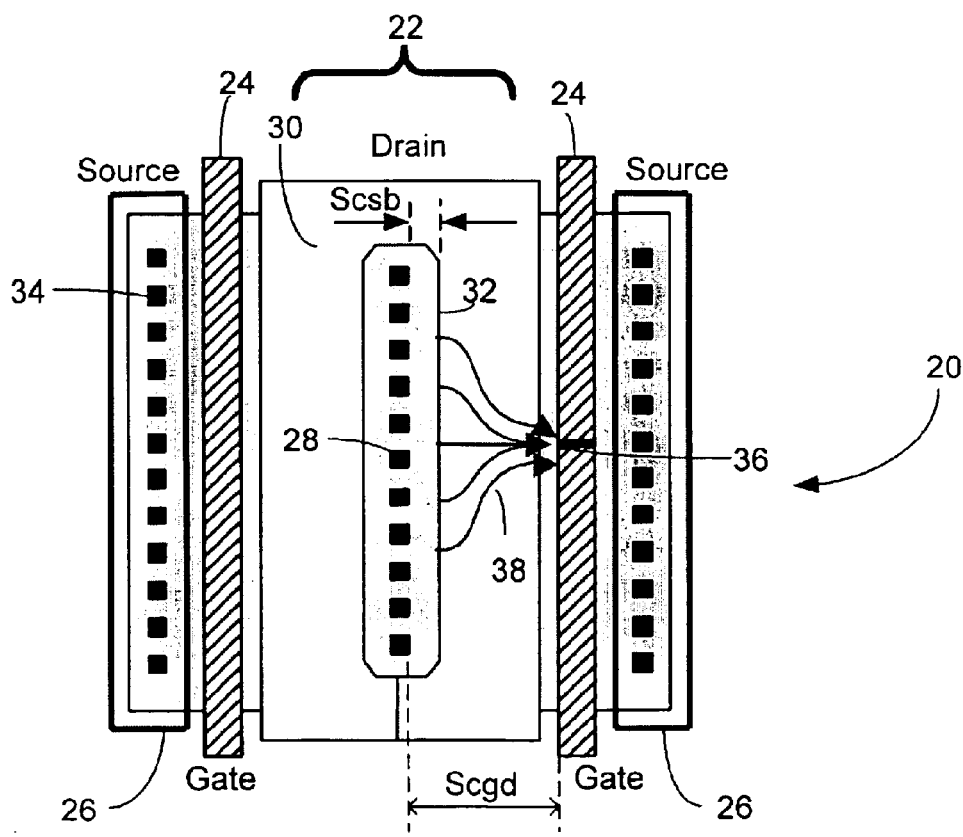
FIG. 2 is a schematic diagram of a conventionally ballasted MOSFET device.

As can be seen in FIG. 2, the active or diffusion areas of the sources and drains are defined by segmented and interleaved diffusion areas. Drain 120, for example, is defined by diffusion segments 122 extending away from gate 115 and interleaved with diffusion segments 124 extending away from gate 125. In addition to being segmented and interleaved, each drain segment is staggered such that it is not directly opposite a source segment. That is, for a filament hot spot formed through the gate opposite a contact in the drain segment (or source segment), there is no straight line current path from that hot spot filament to a contact in an opposing source segment (or drain segment).

In gate 135, for example, a hot spot filament 136 has formed. It can be seen that there is no straight current path from filament 136 to any of the contacts and drain segments in drain 140. In order for current to flow from filament 136, through drain segment 144 to drain contact 143, for example, it must follow the lateral path Sx and then the vertical path Sy. Similarly, to reach contact 142 through drain segment 141 the current path must first flow laterally from filament 136 and then vertically to contact 142. The same holds true for all of the other drain segments and contacts in drain 140. Thus, the path that a filament current has to take in going from drain contacts to source contacts is lengthened and non-linear, thereby adding to the resistance that the filament sees, and inhibiting thermal runaway and the formation of a melt filament.

The filament current path resistance is strongly dependent on the lateral path component, Sx. The lateral path component Sx, in turn, is determined primarily by the poly gate diffusion overlap parameter Wag and the segment spacing parameter Saa. The diffusion overlap distance Wag of the poly gates can be quite small, thereby constraining and adding resistance to the lateral current path Sx (i.e., the lateral current has a smaller "pipe" to flow through). It may be, for example, about 0.3 $\mu$m for a 0.15 $\mu$m process. The maximum length of Saa is determined by the contact electromigration current limit specification relative to the MOSFET current in the normal conduction mode. More contacts per segment could be added in order to permit increase of Saa and thereby increase the filament path lateral resistant component Sx. It should be noted, however, that this would lower the net contact resistance which also contributes to ballasting.

The use of segmented and interleaved diffusion areas results in a reduced drain active area relative to the conventional MOSFET configuration of FIG. 2. Consequently, the drain capacitance for the MOSFET structure of this invention is quite low relative to conventional configurations.

Additional resistance may be added to the filament conduction path by using vias to contact the drain and source contacts in metal 1 (the first metal layer) to the drain and source terminals of the MOSFET, which would be located in metal 2 (the second metal layer). This method of adding path resistance is useful only if a relatively highly resistive material such as tungsten is used for the via. Materials such as copper have too little resistance to be useful.

Figure 4:
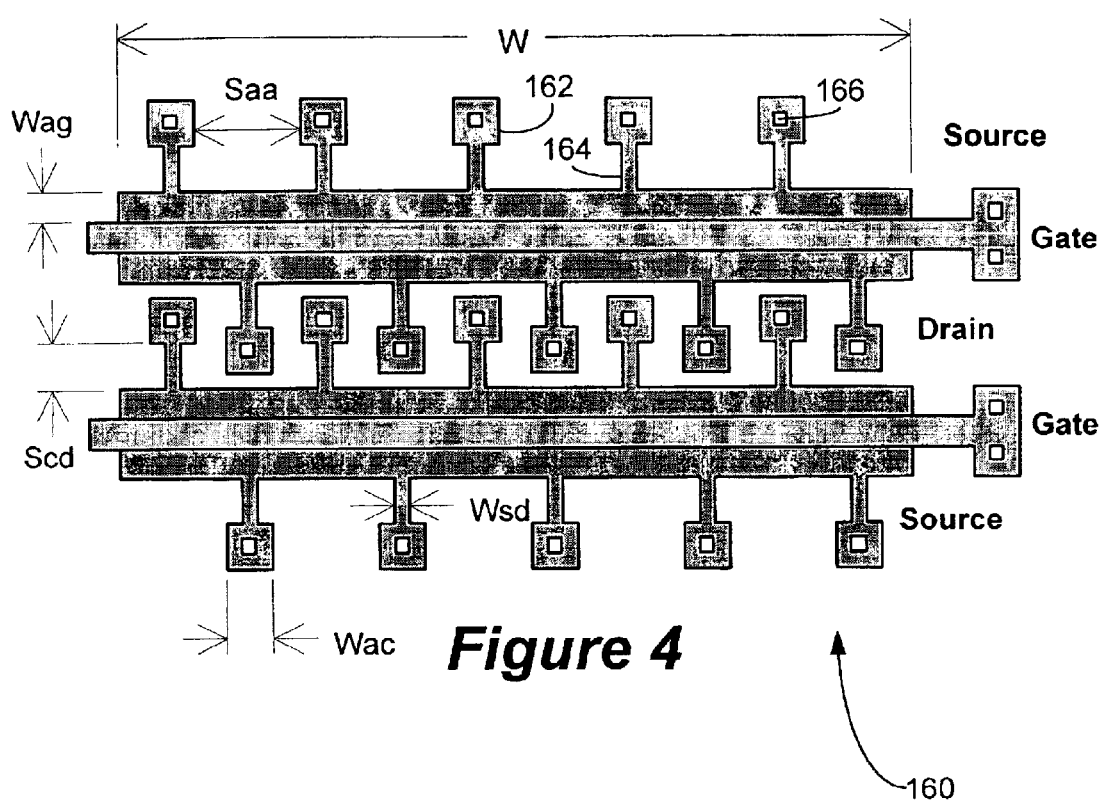
FIG. 4 is a schematic diagram of a MOSFET device according to a second embodiment of the invention.

Another embodiment of the invention is illustrated in FIG. 4. Multi-finger MOSFET device 160 is very similar to device 100 of FIG. 3, but the source and drain diffusion segments 162 are recessed in areas 164 outside the contact 166. Hence, filament conduction currents have a greater lateral distance to flow, as well as a narrower vertical path to flow through to get to the contact. The minimum active lateral width Wsd for recessed areas 164 in a 0.15 μm process is about 0.2 μm, in which case the lateral width Wac of segments 162 in the region of contacts 166 is about 0.45 μm. It has been seen that the diffusion resistance over the vertical length Scd of recessed areas 164 can be increased over the solid diffusion case.

Figure 5:
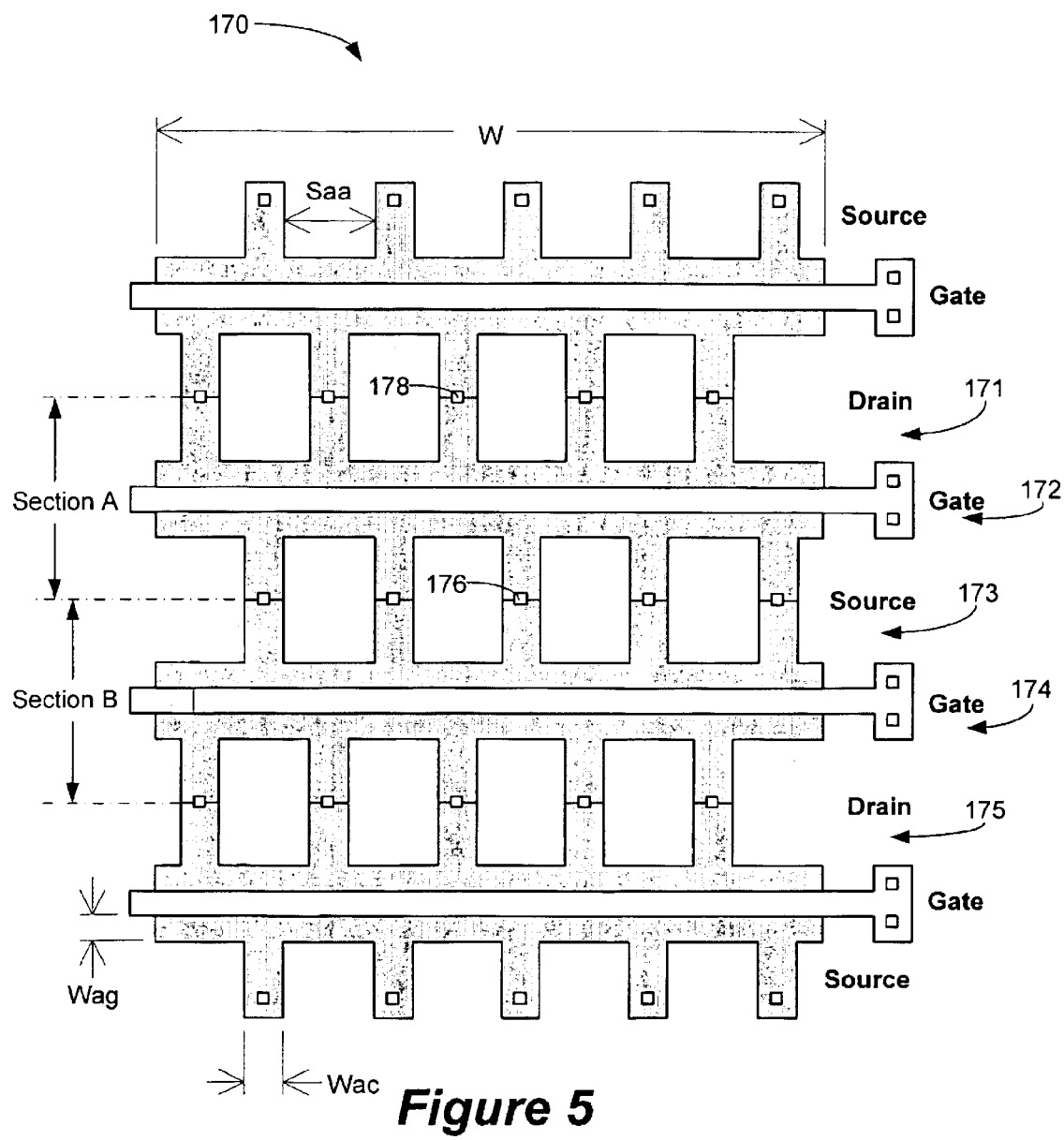
FIG. 5 is a schematic diagram of a MOSFET device according to a third embodiment of the invention.

Another embodiment of the invention is illustrated in FIG. 5. Multi-fingered MOSFET device 170 is similar to the previously illustrated MOSFET devices in that the source and drain diffusion segments are segmented and staggered such that the resistance to filament conduction currents is increased. MOSFET 170 differs, however, in that the drain/source contacts are shared in adjacent MOSFET sections. Consider, for example, MOSFET section A defined by drain 171, gate 172 and source 173; and MOSFET section B, defined by source 173, gate 174 and drain 175. Sections A and B share a common source 173 and share source contacts 176 as well. It can be seen that filament currents will still be required to follow both lateral and vertical paths to move from a drain contact 178 to a source contact 176.

MOSFET device 170 stands in contrast to a configuration such as MOSFET device 100 of FIG. 3, where it can be seen that adjacent MOSFET sections sharing a drain 140 do not share drain contacts. The drain contacts from the MOSFET section above drain 140 extend from gate 135, and the drain contacts for the MOSFET section below drain 140 extend from gate 145 shows yet another variation of FIG. 2 in which the contacts for interior sections are shared between two sections. The disadvantage of sharing drain/source contacts while maintaining staggered and segmented drain/source diffusion areas is that the area efficiency is less. This is readily seen by a visual comparison of FIGS. 3 and 5.

Figure 6:
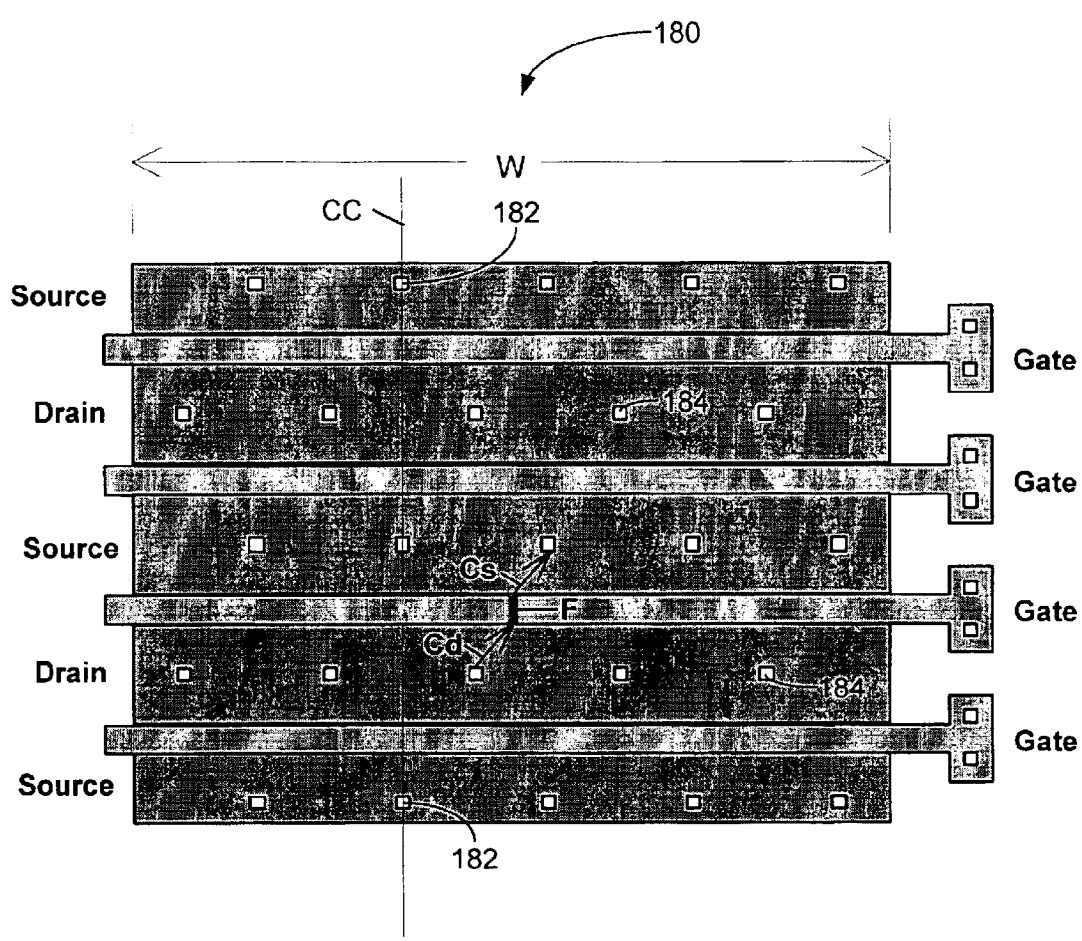
FIG. 6 is a schematic diagram of a MOSFET device according to a fourth embodiment of the invention.

Another embodiment of the invention is illustrated in FIG. 6. In MOSFET device 180, the source and drain diffusion areas are not segmented, but, source contacts 182 and drain contacts 184 are staggered with respect to each other and are sparse in numbers. In this approach the contact density is made low with the lower limit being established either by the electromigration limit or by the ESD limit. The electromigration limit is related to the current handling reliability of the contacts when the MOSFET is operated in a normal mode.

With reference to line CC extending through source contacts 182, it can be seen that source contacts 182 do not line up with drain contacts 184. Rather, drain contacts 184 are placed centrally between source contacts 182 in order to maximize the resistance seen by a hot spot drain to source filament such as F. Reducing the contact density and increasing the current path length through the diffusion by staggering the drain contacts with respect to the source contacts maximizes the resistance seen by the filament. The current feeding filament F must pass diagonally through the drain (Cd) and source diffusion (Cs) rather than in a straight vertical path as is typically the case when drain and source contacts are laid out in vertical line.

Figure 7:
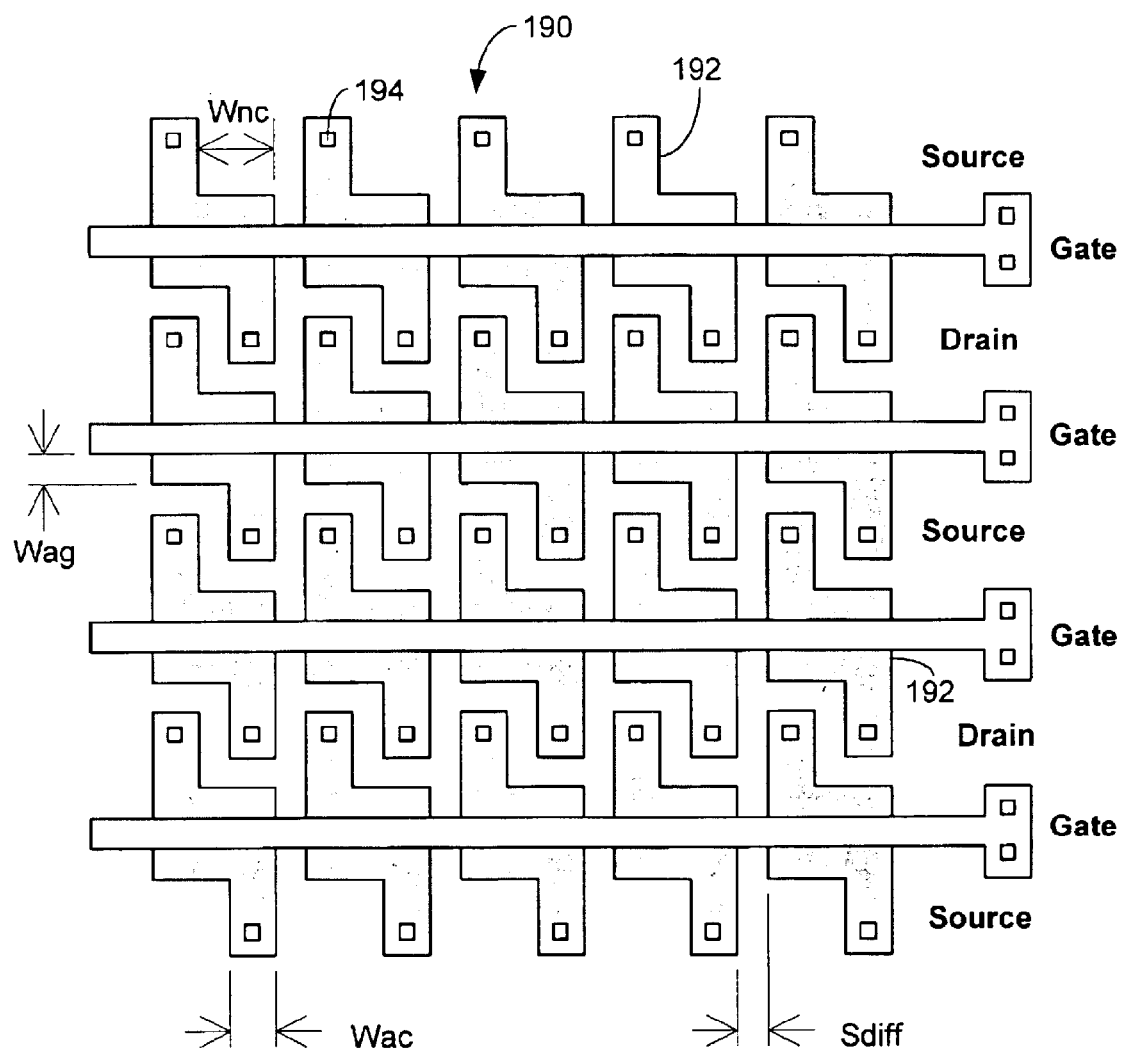
FIG. 7 is a schematic diagram of a MOSFET device according to a fifth embodiment of the present invention.

Another embodiment of the invention is illustrated in FIG. 7. In MOSFET device 190, the source and drain segments 192 are staggered, segmented and isolated from each other. Hence, in contrast to MOSFET device 100 of FIG. 3 where the source and drain diffusion segments are joined in the diffusion areas adjacent the gate, each segment 192 associated with a contact 194 is completely isolated from adjacent segments by a lateral spacing Sdiff. This further increases the resistance seen by a filament hot spot since the current associated with a hot spot must not only file a meandering lateral and vertical current path, it is confined to a single drain/source diffusion segment.

Figure 8:
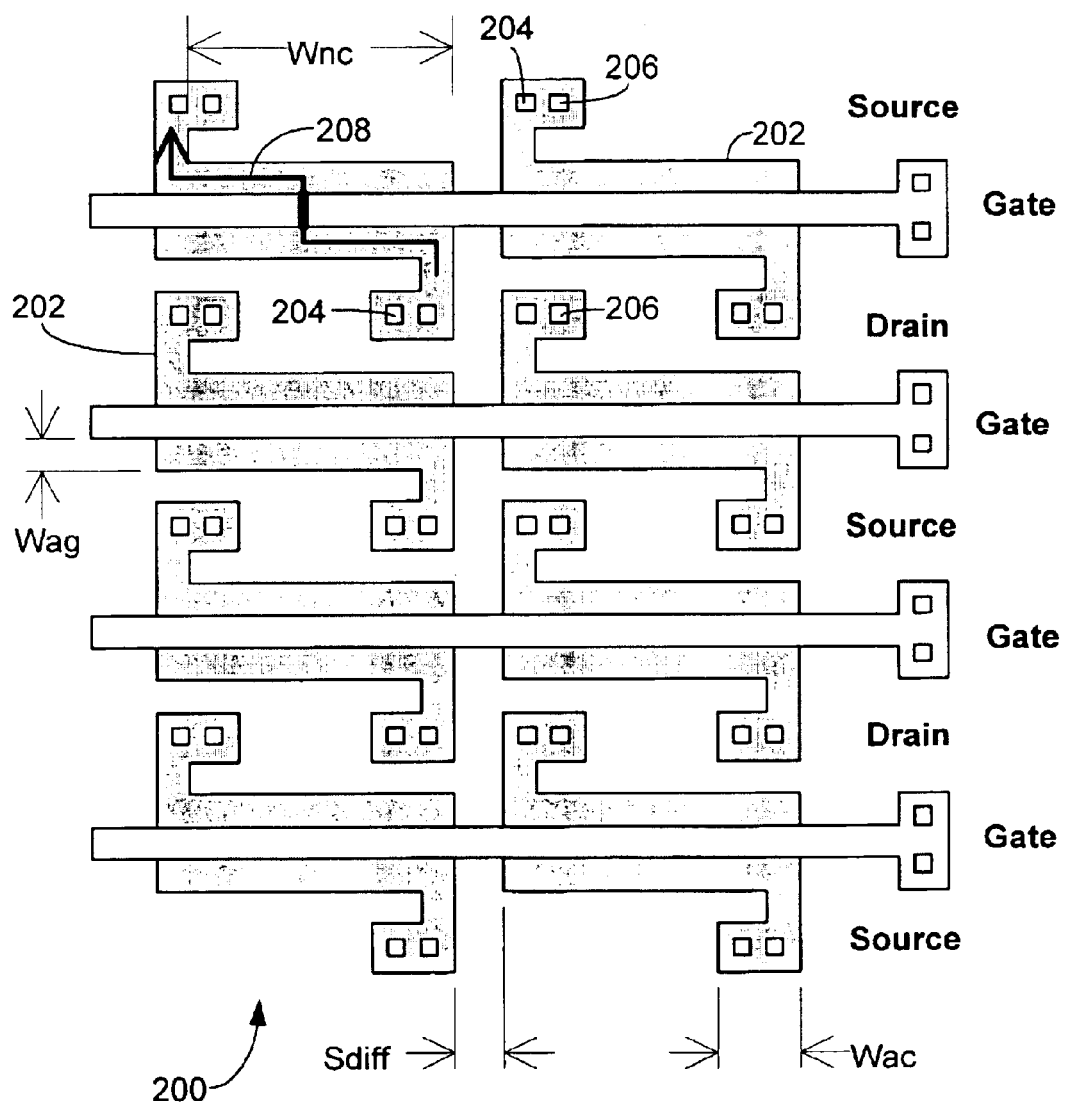
FIG. 8 is a schematic diagram of a MOSFET device according to a sixth embodiment of the present invention.

Another embodiment of the invention is depicted in FIG. 8. MOSFET device 200 is very similar to MOSFET device 190 of FIG. 7, but more contacts have been added to each segment in order to permit increase of the lateral segment width Wnc. In FIG. 8, for example, each segment 202 has two contacts 204 and 206. The lateral segment width Wnc is limited by the contact current density limit imposed by reliability considerations when the MOSFET is in the normal conduction mode. Thus, Wnc can be made roughly twice as long as that of the embodiment of FIG. 7. Any reasonable number of contacts can be added to so that Wnc can be made as large as necessary to promote uniform ESD level conduction. FIG. 8 also depicts a "hot spot" conduction path 208 where it can be seen that a conduction current must flow both laterally and vertically through a drain/source diffusion segment.

Figure 9:
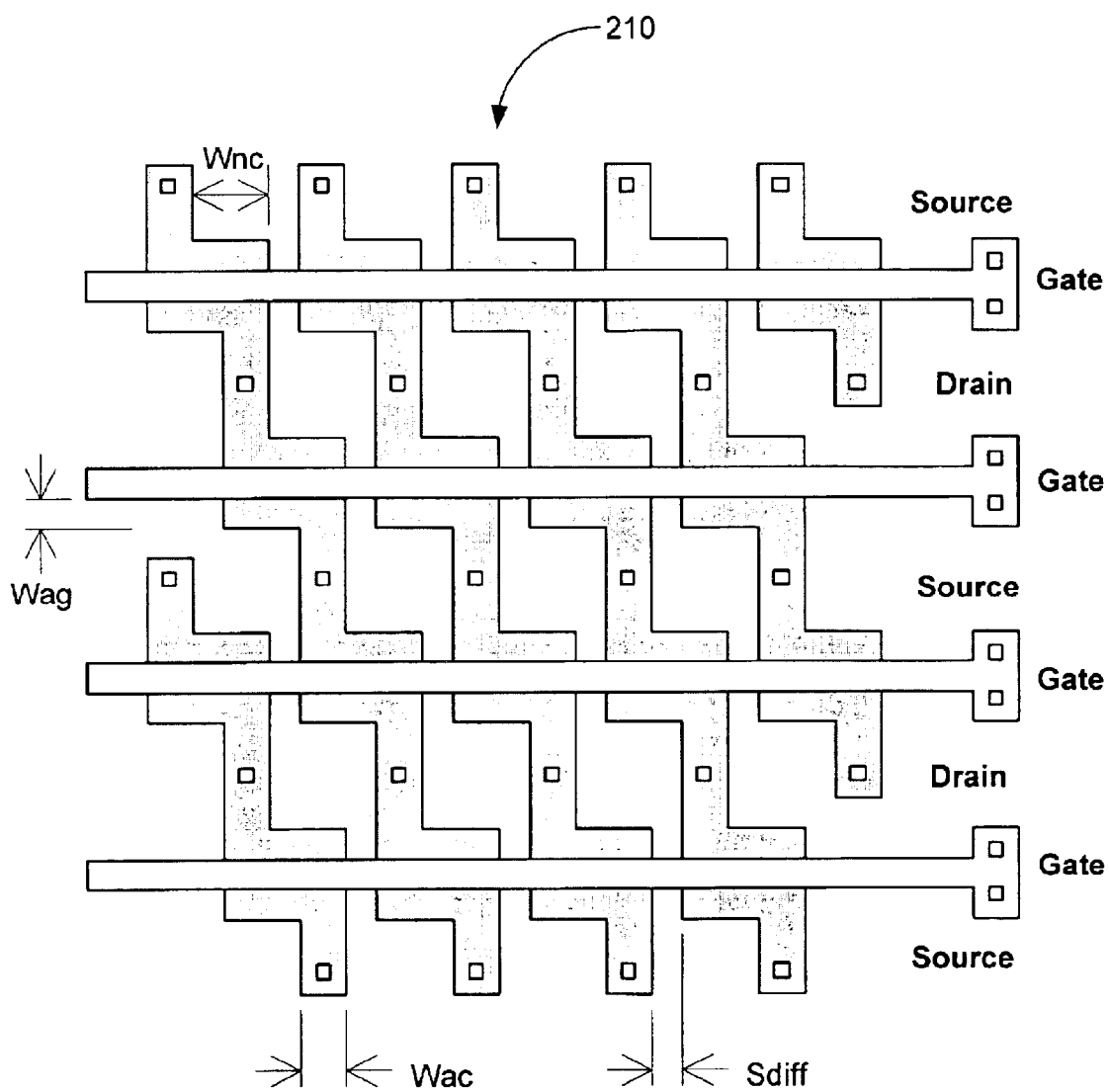
FIG. 9 is a schematic diagram of a MOSFET device according to a seventh embodiment of the present invention.
Figure 10:
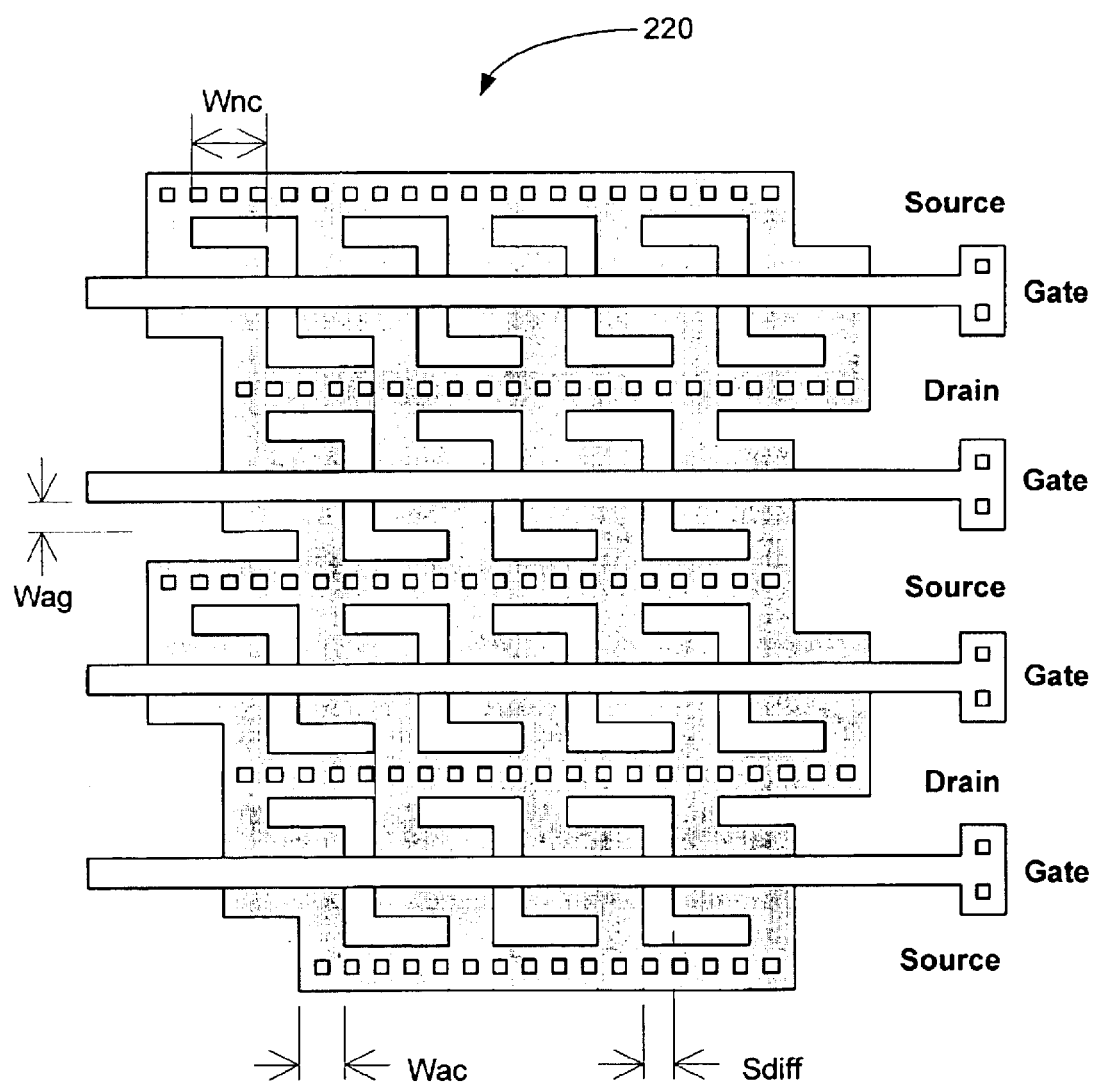
FIG. 10 is a schematic diagram of a MOSFET device according to an eighth embodiment of the present invention.

Another embodiment of the invention is illustrated in FIG. 9. MOSFET device 210 combines the concepts of FIGS. 5 and 7: the source and drain segments are isolated (i.e., the diffusion areas are interrupted by non-diffusion areas Sdiff in the regions near the gate), segmented and staggered, and adjacent MOSFET sections share source/drain contacts. MOSFET device 210 may be laid out more compactly than MOSFET device 190, but contact current density limitations restrict the lateral segment width Wnc. As was done in MOSFET 200 of FIG. 8, more contacts per segment can be added to allow Wnc to grow in length. In FIG. 10, for example, the contact density per unit of length of MOSFET device 220 is increased to that of a normally drawn NFET in which the drain and source contacts are shared between fingers. Thus, Wnc of MOSFET 220 can be of any dimension that is practical or reasonable without any limitation on contact current density.

The MOSFET devices described herein may be implemented in any IC where ESD protection is required. Potential applications include, but are not limited to, I/O driver transistors, ESD clamps, and power transistors. Numerous advantages are provided by the present invention relative to conventional ballasting methods using a drain salicide block mask. As set forth in detail, hot spot melt filaments formed in the gate region between the drain and source see an increased conduction path resistance. This is accomplished by staggering and segmenting the drain and source diffusion areas and contacts, so that conduction currents are required to follow a non-linear path from drain contact to source contact (or vice-versa). The elimination of a salicide block mask also provides the advantage of a more compact layout, which is a premium in IC design. By decreasing the drain size, a lower drain capacitance is also provided. Where Wac+Saa=2.5 um, for example, the drain capacitance is lowered by a factor of 3 relative to a conventionally-ballasted MOSFET.

While various embodiments of the invention have been described, it will be apparent to those of ordinary skill in the art that many more embodiments and implementations are possible that are within the scope of this invention.

What is claimed is:

1. A field transistor device for providing electrostatic discharge protection comprising:

a gate;

a source diffusion area segmented into source segments and having source contacts; and a drain diffusion area segmented into drain segments and having drain contacts, wherein the source segments are staggered relative to the drain segments and the drain contacts are staggered relative to the source contacts so that current associated with any hot spot filaments see an increased resistance in a conduction path from a source contact to a drain contact, and wherein the source segments and drain segments extend vertically away from the gate and are joined by laterally extending diffusion regions adjacent the gate.

2. A transistor device as claimed in claim 1, wherein the conduction path from source contact to drain contact is non-linear.

3. A transistor device as claimed in claim 1 wherein the laterally extending diffusion regions are configured to be long and narrow in order to increase the conduction path resistance seen by a hot spot filament.

4. A transistor device as claimed in claim 1 wherein the source contacts and drain contacts are formed in a first metal layer and are connected by vias to terminals formed in a second metal layer in order to further increase the filament conductive path resistance.

5. A transistor device as claimed in claim 4, wherein the vias are formed from tungsten.

6. An I/O driver transistor comprising a transistor device as claimed in claim 1.

7. An ESD clamp comprising a transistor device as claimed in claim 1.

8. A field transistor device for providing electrostatic discharge protection comprising:

a gate;

a source diffusion area segmented into source segments and having source contacts; and a drain diffusion area segmented into drain segments and having drain contacts, wherein the source segments are staggered relative to the drain segments and the drain contacts are staggered relative to the source contacts so that current associated with any hot spot filaments see an increased resistance in a conduction path from a source contact to a drain contact, and wherein the device defines a plurality of adjacent transistors that share adjacent drains and sources, wherein the drain/source segments of adjacent gates are not coupled and the drain/source contacts of adjacent transistors are not shared.

* * * * *